(12) United States Patent
Mishima et al.

(10) Patent No.: US 12,538,612 B2
(45) Date of Patent: Jan. 27, 2026

(54) LIGHT-EMITTING DIODE ELEMENT

(71) Applicant: HAMAMATSU PHOTONICS K.K., Hamamatsu (JP)

(72) Inventors: Asuka Mishima, Hamamatsu (JP); Daisuke Iida, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 371 days.

(21) Appl. No.: 18/275,231

(22) PCT Filed: Nov. 11, 2021

(86) PCT No.: PCT/JP2021/041506
§ 371 (c)(1),
(2) Date: Aug. 1, 2023

(87) PCT Pub. No.: WO2022/180942
PCT Pub. Date: Sep. 1, 2022

(65) Prior Publication Data
US 2024/0120438 A1    Apr. 11, 2024

(30) Foreign Application Priority Data
Feb. 26, 2021  (JP) .................... 2021-029705

(51) Int. Cl.
*H10H 20/812* (2025.01)
*H10H 20/81* (2025.01)
*H10H 20/824* (2025.01)

(52) U.S. Cl.
CPC .......... *H10H 20/812* (2025.01); *H10H 20/81* (2025.01); *H10H 20/824* (2025.01)

(58) Field of Classification Search
CPC .... H10H 20/812; H10H 20/81; H10H 20/824; H10H 20/831; H10H 20/8242; H10H 20/816; H10H 20/84
See application file for complete search history.

(56) References Cited

U.S. PATENT DOCUMENTS

2012/0073638 A1* 3/2012 Zhang .................. H10F 10/142
257/E29.081
2016/0380409 A1* 12/2016 Ooi ..................... H01S 5/34326
438/47

FOREIGN PATENT DOCUMENTS

JP    H7-202260 A    8/1995
JP    2004-172439 A  6/2004
(Continued)

OTHER PUBLICATIONS

Choi, H. K. et al., "InAsSb/InAlAs strained quantum-well lasers emitting at 4.5 um," Applied Physics Letters, Jun. 26, 1995, vol. 66, No. 26, pp. 3543-3545.
(Continued)

*Primary Examiner* — Mark W Tornow
(74) *Attorney, Agent, or Firm* — Faegre Drinker Biddle & Reath LLP

(57) ABSTRACT

A light-emitting diode element includes a semiconductor substrate having a first surface and a second surface on a side opposite to the first surface, a semiconductor lamination portion formed on the first surface of the semiconductor substrate, a first electrode connected to a part of the semiconductor lamination portion on the semiconductor substrate side, and a second electrode connected to a part of the semiconductor lamination portion on a side opposite to the semiconductor substrate. The semiconductor lamination portion includes an n-type semiconductor layer, an active layer having a p-type conductivity and laminated on the n-type semiconductor layer, and a p-type semiconductor layer laminated on the active layer on a side opposite to the n-type semiconductor layer. The active layer has a multiple quantum well structure constituted of barrier layers including AlInAs and well layers including InAsSb alternately laminated therein.

6 Claims, 8 Drawing Sheets

(56) References Cited

FOREIGN PATENT DOCUMENTS

| | | |
|---|---|---|
| JP | 2009-158831 A | 7/2009 |
| JP | 2019-009438 A | 1/2019 |
| WO | WO-2020/196411 A1 | 10/2020 |

OTHER PUBLICATIONS

Hoof, C. Van et al., "Mid-infrared LEDs using $InAs_{0.71}Sb_{0.29}$/InAs/$Al_{0.25}In_{0.75}As$/InAs Strained-layer Superlattice active layers," ASDAM'98, $2^{nd}$ International Conference on Advanced Semiconductor Devices and Microsystems, Oct. 1998, pp. 287-290.

International Preliminary Report on Patentability mailed Sep. 7, 2023 for PCT/JP2021/041506.

* cited by examiner (a)

(b)

LIGHT-EMITTING DIODE ELEMENT

TECHNICAL FIELD

The present disclosure relates to a light-emitting diode element.

BACKGROUND ART

Patent Literature 1 discloses a semiconductor laser device. In a semiconductor laser element thereof, an n-type AlGaAs cladding layer, a GaAs lower optical waveguide layer, a GaInAs/GaNAs multiple quantum well active layer, a GaAs upper optical waveguide layer, a p-type AlGaAs cladding layer, and a p-type GaAs contact layer are sequentially laminated on a n-type GaAs substrate. The multiple quantum well active layer has a constitution in which upper and lower parts of a GaInAs quantum well layer are sandwiched by GaNAs barrier layers.

CITATION LIST

Patent Literature

[Patent Literature 1] Japanese Unexamined Patent Publication No. 2004-172439

SUMMARY OF INVENTION

Technical Problem

Incidentally, in an infrared light emitting diode (LED) having a light emission wavelength of 3 μm to 5 μm, it is conceivable to use an AlInAs/InAsSb multiple quantum well active layer. According to the knowledge of the present inventor, in such an infrared LED, even if the number of quantum wells is increased to a certain level or higher (for example, ten or more), a light emission output tends not to increase in accordance with increase in the number of quantum wells.

Hence, an object of the present disclosure is to provide a light-emitting diode element in which a light emission output can be improved.

Solution to Problem

As a result of intensive research to solve the foregoing problems, the present inventor has achieved knowledge that a light emission output can be improved due to increase in the number of quantum wells by doping an active layer with p-type impurities to cause the active layer to have a p-type conductivity (cause electrons to become minority carriers in the active layer) in an LED using an AlInAs/InAsSb multiple quantum well active layer. The present disclosure has been made by advancing further research on the basis of such knowledge.

A light-emitting diode element according to the present disclosure includes a semiconductor substrate having a first surface and a second surface on a side opposite to the first surface, a semiconductor lamination portion formed on the first surface of the semiconductor substrate, a first electrode connected to a part of the semiconductor lamination portion on the semiconductor substrate side, and a second electrode connected to a part of the semiconductor lamination portion on a side opposite to the semiconductor substrate. The semiconductor lamination portion includes an n-type semiconductor layer, an active layer having a p-type conductivity and laminated on the n-type semiconductor layer, and a p-type semiconductor layer laminated on the active layer on a side opposite to the n-type semiconductor layer. The active layer has a multiple quantum well structure constituted of barrier layers including AlInAs and well layers including InAsSb alternately laminated therein. A lattice constant of the barrier layers is smaller than a lattice constant of the n-type semiconductor layer. A lattice constant of the well layers may be larger than the lattice constant of the n-type semiconductor layer.

This light-emitting diode element includes an active layer having a multiple quantum well structure constituted of barrier layers including AlInAs and well layers including InAsSb alternately laminated therein. Further, the active layer has a p-type conductivity. Therefore, as described in the foregoing knowledge, a light emission output can be improved by increasing the number of quantum wells. As above, in this light-emitting diode element, although a light emission output can be improved by increasing the number of quantum wells, in general, if increase in the number of quantum wells progresses, strain may be accumulated when it is produced, resulting in increase in crystal defects. In contrast, in this light-emitting diode element, the lattice constant of the barrier layers is smaller than the lattice constant of the n-type semiconductor layer, and the lattice constant of the well layers is larger than the lattice constant of the n-type semiconductor layer. Accordingly, in this light-emitting diode element, a light emission output can be improved by favorably increasing the number of quantum wells while increase in crystal defects due to accumulation of strain is curbed.

In the light-emitting diode element according to the present disclosure, the active layer may include ten or more pairs of the barrier layers and the well layers. In this manner, according to this light-emitting diode element, a light emission output can be improved by increasing the number of quantum wells to ten or more.

In the light-emitting diode element according to the present disclosure, a concentration of p-type impurities in the active layer may be $1.0 \times 10^{16}/cm^3$ to $1.9 \times 10^{18}/cm^3$. In this case, a light emission output can be more reliably improved.

In the light-emitting diode element according to the present disclosure, a degree of lattice mismatching between an average lattice constant of the barrier layers and the well layers and the lattice constant of the n-type semiconductor layer may be 0.9% or less. In this case, even when the number of quantum wells of the active layer is increased, accumulation of strain can be more reliably curbed.

The light-emitting diode element according to the present disclosure may further include an n-type barrier layer disposed between the n-type semiconductor layer and the active layer and including AlInAs, and a p-type barrier layer disposed between the active layer and the p-type semiconductor layer and including AlInAs. In this case, carriers can be favorably confined in the active layer by providing barrier layers on both sides of the active layer.

In the light-emitting diode element according to the present disclosure, the semiconductor lamination portion may have a base portion having a third surface facing a side opposite to the semiconductor substrate, and a mesa portion provided in the base portion in a manner of protruding from an area of a part on the third surface, having a top surface facing a side opposite to the base portion, and including at least the active layer. The first electrode may be formed on the third surface in a manner of surrounding the mesa portion when viewed in a direction intersecting the third surface. The second electrode may be formed on the top surface in a manner of covering a central area of the top surface. The second surface of the semiconductor substrate may serve as a light emitting surface. In this case, a current path is formed in a wider region in the mesa portion due to the first electrode surrounding the mesa portion including the active layer and the second electrode on the top surface of the mesa portion, and the second surface of the semiconductor substrate on a side opposite to the top surface of the mesa portion having the second electrode formed thereon serves as the light emitting surface. Therefore, a light emission output can be more reliably improved.

Advantageous Effects of Invention

According to the present disclosure, it is possible to provide a light-emitting diode element in which a light emission output can be improved.

DESCRIPTION OF EMBODIMENT

Hereinafter, an embodiment will be described in detail with reference to the drawings. In description of the drawings, the same reference signs are applied to elements which are the same or duplicates, and duplicate description may be omitted. In addition, an orthogonal coordinate system defined by an X axis, a Y axis, and a Z axis may be indicated in the following drawings.

Figure 1:
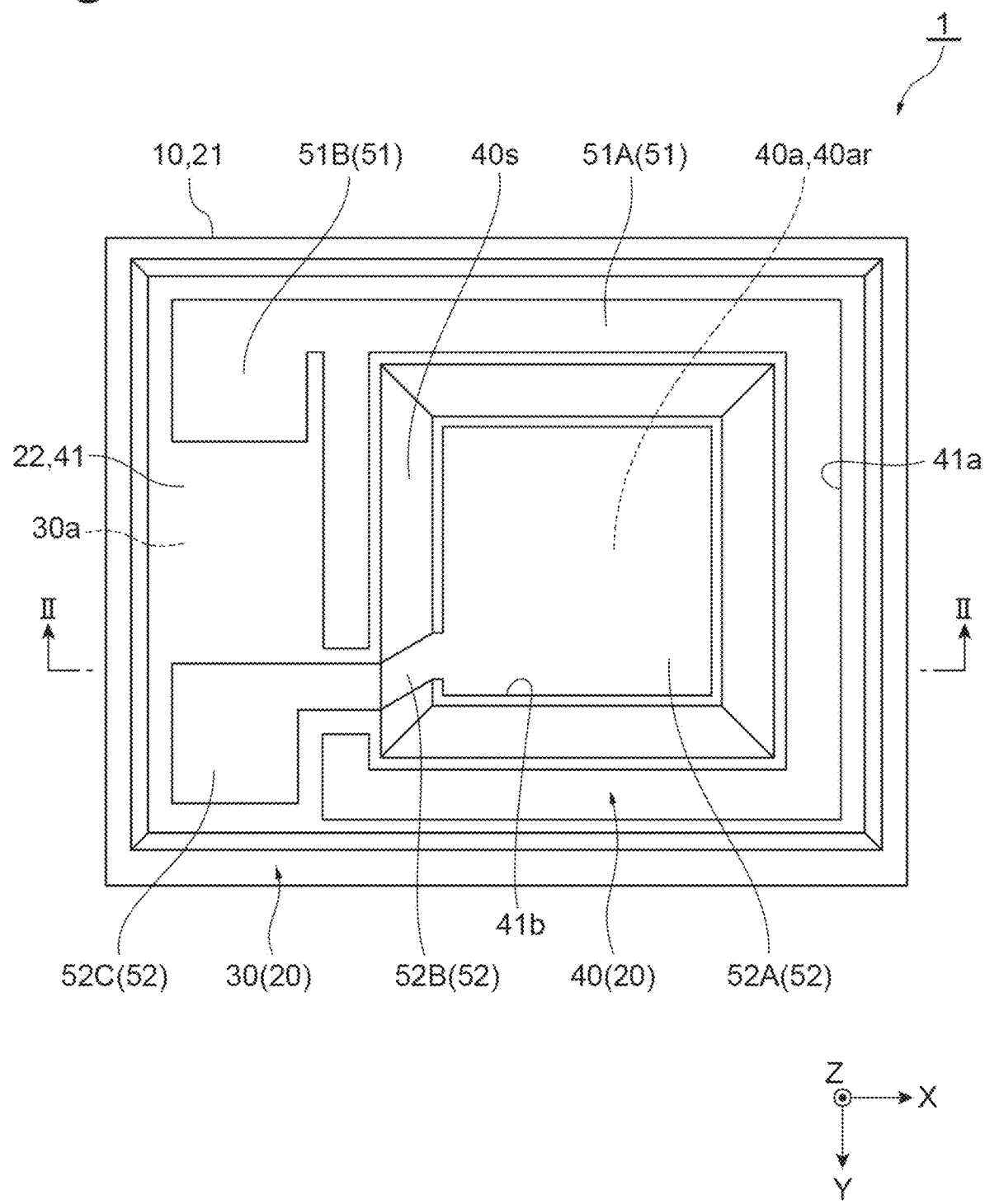
FIG. 1 is a plan view of a light-emitting diode element according to the present embodiment.
Figure 2:
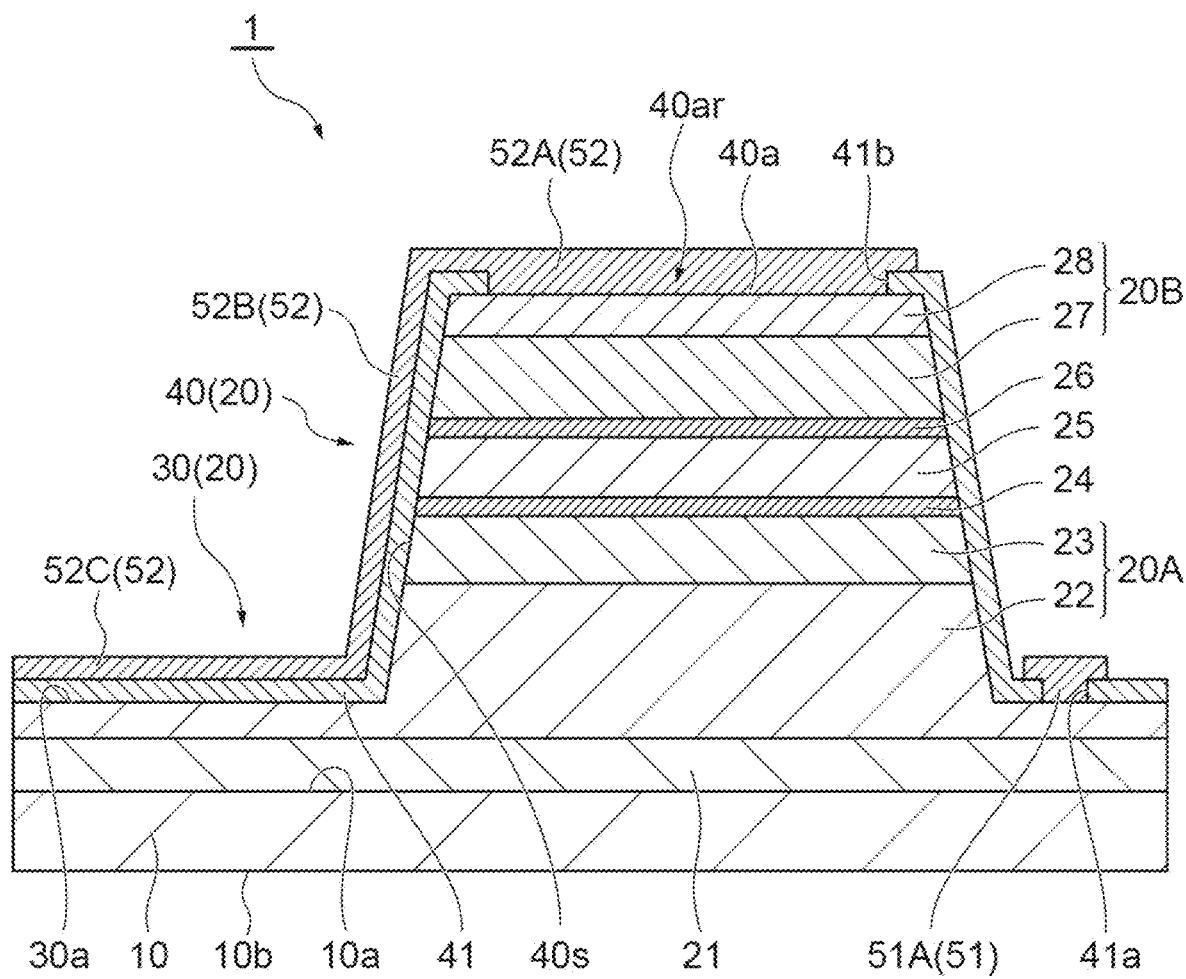
FIG. 2 is a cross-sectional view along line II-II in FIG. 1.
Figure 2:
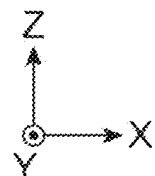

FIG. 1 is a plan view of a light-emitting diode element according to the present embodiment. FIG. 2 is a cross-sectional view along line II-II in FIG. 1. A light-emitting diode element 1 illustrated in FIGS. 1 and 2 is an infrared LED having a light emission wavelength of 3 μm to 5 μm, as an example. The light-emitting diode element 1 includes a semiconductor substrate 10, a semiconductor lamination portion 20, a first electrode 51, and a second electrode 52. The semiconductor substrate 10 has a main surface (first surface) 10a and a rear surface (second surface) 10b on a side opposite to the main surface 10a. For example, the semiconductor substrate 10 is formed of GaAs.

The semiconductor lamination portion 20 includes a base portion 30 and a mesa portion 40. The base portion 30 is formed on the main surface 10a of the semiconductor substrate 10. The base portion 30 comes into contact with the main surface 10a. The base portion 30 includes a front surface (third surface) 30a facing a side opposite to the semiconductor substrate 10. The mesa portion 40 is provided in the base portion 30 in a manner of protruding from an area of a part of the front surface 30a of the base portion 30. The mesa portion 40 includes a top surface 40a facing a side opposite to the semiconductor substrate 10 and the base portion 30, and a side surface 40s extending from the top surface 40a and reaching the front surface 30a of the base portion 30.

The semiconductor lamination portion 20 includes at least an n-type semiconductor layer 20A, an active layer 25 laminated on the n-type semiconductor layer 20A, and a p-type semiconductor layer 20B laminated on the active layer 25 on a side opposite to the n-type semiconductor layer 20A. These are laminated in the order of the n-type semiconductor layer 20A, the active layer 25, and the p-type semiconductor layer 20B from the semiconductor substrate 10 side. Each layer of the semiconductor lamination portion 20 will be specifically described.

The semiconductor lamination portion 20 includes a buffer layer 21, a current diffusion layer 22, a current block layer 23, a barrier layer 24, the active layer 25, a barrier layer 26, a semiconductor layer 27, and a contact layer 28, which are laminated on the main surface 10a of the semiconductor substrate 10 in this order. For example, the buffer layer 21 is a non-doped layer and includes InAs and GaAs. As an example, the buffer layer 21 can be formed by causing a GaAs layer to grow on the semiconductor substrate 10 with a thickness of approximately 0.2 μm, causing an InAs layer to grow on the GaAs layer with a thickness of approximately 0.2 μm at a low temperature, and further causing another InAs layer to grow on the InAs layer with a thickness of approximately 0.2 μm at a normal temperature.

The current diffusion layer 22 has an n-type conductivity. For example, the current diffusion layer 22 includes InAs. As an example, the current diffusion layer 22 can be formed by causing an InAs layer to grow on the buffer layer 21 with a thickness of approximately 4.0 μm. A concentration of n-type impurities in the current diffusion layer 22 is approximately $3.0 \times 10^{18}/cm^3$, as an example. The current diffusion layer 22 forms contact with the first electrode 51 as will be described below and also functions as a contact layer.

The current block layer 23 has the n-type conductivity. For example, the current block layer 23 includes InAs. As an example, the current block layer 23 can be formed by causing an InAs layer to grow on the current diffusion layer 22 with a thickness of approximately 0.65 μm. The concentration of the n-type impurities in the current block layer 23 is lower than the concentration of the n-type impurities in the current diffusion layer 22 and is approximately $3.0 \times 10^{17}$ $cm^3$, as an example. The current diffusion layer 22 and the current block layer 23 constitute the n-type semiconductor layer 20A. For example, a material of the n-type semiconductor layer 20A may be AlInAs or InGaAs. In addition, the n-type semiconductor layer 20A may include a layer different from the current diffusion layer 22 and the current block layer 23.

The barrier layer (n-type barrier layer) 24 is disposed between the n-type semiconductor layer 20A and the active layer 25. Here, the barrier layer 24 comes into contact with the n-type semiconductor layer 20A (current block layer 23) and the active layer 25. The barrier layer 24 has the n-type conductivity. The barrier layer 24 includes Al. More specifically, the barrier layer 24 includes AlInAs. As an example, the barrier layer 24 can be formed on the current block layer 23 by causing an AlInAs layer to grow with a thickness within a range not exceeding a critical film thickness with respect to the n-type semiconductor layer 20A (as an example, approximately 0.02 μm). The concentration of the n-type impurities in the barrier layer 24 is approximately $4.5 \times 10^{18}/cm^3$, as an example. An Al composition in the barrier layer 24 is equal to or higher than the Al composition in a barrier layer of the active layer 25 which will be described below.

The active layer 25 has a p-type conductivity. The active layer 25 has a multiple quantum well structure constituted of barrier layers having the p-type conductivity and including AlInAs, and well layers having the p-type conductivity and including InAsSb, which are alternately laminated therein. The number of quantum wells in the active layer 25, that is, the number of pairs of barrier layers and well layers is ten or more. There is no upper limit for the number of quantum wells in the active layer 25 (for example, it may be several hundred). However, from the viewpoint of easiness of manufacturing, as an example, it may be 80 or fewer or it may further be 40 or fewer.

At this time, for example, a thickness of the active layer 25 can be 0.2 μm to 1.6 μm or it can further be 0.2 μm to 0.8 μm. A concentration of p-type impurities in the active layer 25 is in a range in which electrons become minority carriers in each of the barrier layers and the well layers. As an example, it is approximately $1.0 \times 10^{16}/cm^3$ to $1.9 \times 10^{18}/cm^3$. Furthermore, it is $1.0 \times 10^{17}/cm^3$ to $1.9 \times 10^{18}/cm^3$. In addition, a thickness of each of the barrier layers and the well layers can be within a range not exceeding the critical film thickness with respect to the n-type semiconductor layer 20A.

On the other hand, in the active layer 25, a lattice constant of the barrier layers is smaller than a lattice constant of the n-type semiconductor layer 20A, and a lattice constant of the well layers is larger than the lattice constant of the n-type semiconductor layer 20A. More specifically, in the active layer 25, a degree of lattice mismatching between an average lattice constant of the barrier layers and the well layers and the lattice constant of the n-type semiconductor layer 20A is 0.9% or less.

The barrier layer (p-type barrier layer) 26 is disposed between the active layer 25 and the p-type semiconductor layer 20B. Here, the barrier layer 26 comes into contact with the p-type semiconductor layer 20B (semiconductor layer 27) and the active layer 25. The barrier layer 26 has the p-type conductivity. The barrier layer 26 includes Al. More specifically, the barrier layer 26 includes AlInAs. As an example, the barrier layer 26 can be formed on the active layer 25 by causing an AlInAs layer to grow with a thickness of approximately 0.02 μm, for example. The concentration of the p-type impurities in the barrier layer 26 is approximately $3.0 \times 10^{18}/cm^3$, as an example. The Al composition in the barrier layer 26 is equal to or higher than the Al composition in the barrier layer of the active layer 25.

For example, the semiconductor layer 27 includes InAs. As an example, the semiconductor layer 27 can be formed by causing an InAs layer to grow on the barrier layer 26 with a thickness of approximately 0.5 μm. The semiconductor layer 27 has the p-type conductivity. The concentration of the p-type impurities in the semiconductor layer 27 is higher than the concentration of the p-type impurities of the barrier layer 26 and is lower than the concentration of the p-type impurities in the contact layer 28. The concentration of the p-type impurities in the semiconductor layer 27 is approximately $5.0 \times 10^{18}/cm^3$, for example. For example, the semiconductor layer 27 functions as a cladding layer and functions as a current diffusion layer.

The contact layer 28 has the p-type conductivity. For example, the contact layer 28 includes InAs. As an example, the contact layer 28 can be formed by causing an InAs layer to grow on the semiconductor layer 27 with a thickness of approximately 0.05 μm. The concentration of the p-type impurities in the contact layer 28 is approximately $1.0 \times 10^{19}/cm^3$, as an example. The contact layer 28 forms contact with the second electrode 52. The semiconductor layer 27 and the contact layer 28 constitute the p-type semiconductor layer 20B.

The base portion 30 includes the buffer layer 21 and a part of the n-type semiconductor layer 20A on the buffer layer 21 side (here, a part of the current diffusion layer 22 on the buffer layer 21 side). The mesa portion 40 includes at least the active layer 25. Here, it includes the remainder of the n-type semiconductor layer 20A, the barrier layers 24 and 26, the active layer 25, and the p-type semiconductor layer 20B. A insulating film 41 is provided on parts of the front surface 30a of the base portion 30, the side surface 40s of the mesa portion 40, and the top surface 40a of the mesa portion 40. For example, the insulating film 41 is formed of $Al_2O_3$.

In the insulating film 41, an opening 41a is formed on the front surface 30a of the base portion 30. The opening 41a has a shape along the external shape of the mesa portion 40 when viewed in a Z direction intersecting the front surface 30a. Here, since the mesa portion 40 has a rectangular external shape when viewed in the Z direction, the opening 41a is formed to have a rectangular ring shape in a manner of surrounding the mesa portion 40. Accordingly, an area of a part on the front surface 30a surrounding the mesa portion 40 when viewed in the Z direction is exposed from the insulating film 41 through the opening 41a.

In addition, in the insulating film 41, an opening 41b is formed on the top surface 40a. Accordingly, the most part on the top surface 40a including a central area 40ar of the top surface 40a is exposed from the insulating film 41. When viewed in the Z direction intersecting the top surface 40a, the central area 40ar is an area excluding an outer edge portion of the top surface 40a. The central area 40ar has an external shape along the external shape of the mesa portion 40. Here, it has a rectangular shape.

The first electrode 51 and the second electrode 52 are connected to the semiconductor lamination portion 20 through the openings 41a and 41b of the insulating film 41. More specifically, the first electrode 51 is an n-electrode and includes a first part 51A and a second part 51B. The first part 51A is formed on the front surface 30a of the base portion 30 with the insulating film 41 therebetween in a manner of surrounding the mesa portion 40 when viewed in the Z direction and is brought into contact with the front surface 30a of the base portion 30 through the opening 41a of the insulating film 41. The front surface 30a of the base portion 30 is a front surface of a part of the semiconductor lamination portion 20 on the semiconductor substrate 10 side. Here, it is a front surface facing a side opposite to the semiconductor substrate 10 in a part of the current diffusion layer 22 on the semiconductor substrate 10 side. Therefore, the first electrode 51 is connected to a part of the semiconductor lamination portion 20 on the semiconductor substrate 10 side. The second part 51B extends from the first part 51A and is disposed on the front surface 30a with the insulating film 41 therebetween. The second part 51B functions as an n-electrode pad.

The second electrode 52 is a p-electrode and includes a first part 52A, a second part 52B, and a third part 52C. The first part 52A is formed on the top surface 40a in a manner of covering at least the central area 40ar when viewed in the Z direction and is brought into contact with the top surface 40a through the opening 41b of the insulating film 41. Therefore, the second electrode 52 is connected to a part of the semiconductor lamination portion 20 on a side opposite to the semiconductor substrate 10. The second part 52B extends from the first part 52A and is disposed on the side surface 40s of the mesa portion 40 with the insulating film 41 therebetween. The third part 52C extends from the second part 52B and is disposed on the front surface 30a of the base portion 30 with the insulating film 41 therebetween. The third part 52C functions as a p-type electrode pad.

In this manner, the most part (central area 40ar) on the top surface 40a of the mesa portion 40 is covered by the second electrode 52. Therefore, in the light-emitting diode element 1, the rear surface 10b of the semiconductor substrate 10 serves as a light emitting surface. In other words, the light-emitting diode element 1 is constituted as a rear surface emission type.

Figure 3:
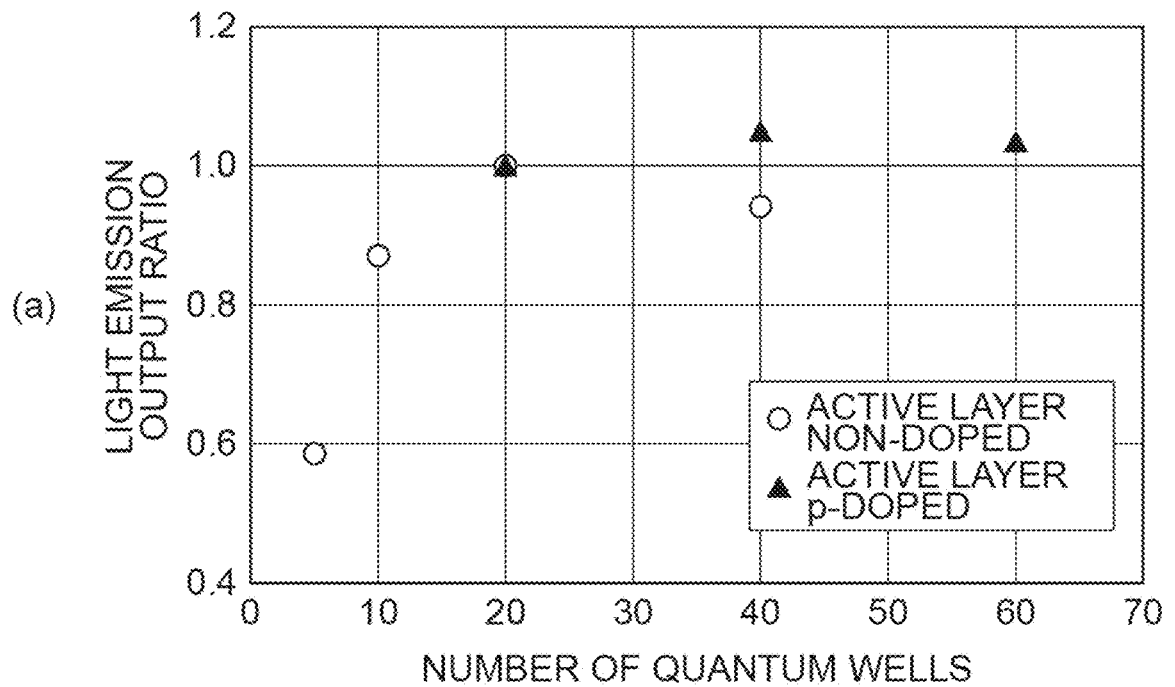
FIG. 3 is a graph showing characteristics of a light emission output of the light-emitting diode element.
Figure 3:
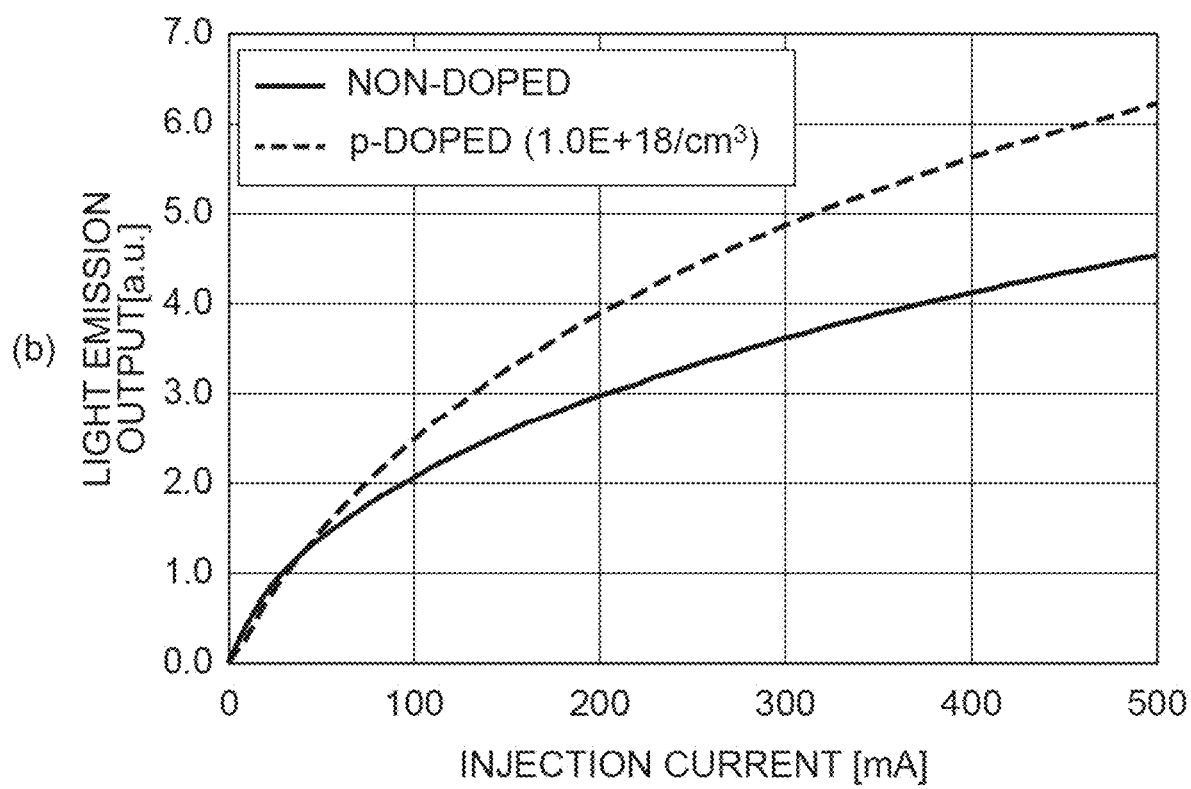

Subsequently, operation and effects of the foregoing light-emitting diode element 1 will be described. FIG. 3 is a graph showing characteristics of a light emission output of the light-emitting diode element. FIG. 3(a) shows a relationship between the number of quantum wells and a light emission output, and FIG. 3(b) shows a relationship between an injection current and a light emission output. Values of points of "the active layer non-doped" of the points in FIG. 3(a) are normalized with the case where the active layer is non-doped and the number of quantum wells is 20 as 1.0. In addition, values of points of "the active layer p-doped" of the points in FIG. 3(a) are normalized with the case where the active layer is doped with the p-type and the number of quantum wells is 20 as 1.0.

In addition, in FIG. 3(a), values of the light-emitting diode element 1 according to the present embodiment are indicated as "the active layer p-doped", and values of a light-emitting diode element according to a comparative example are indicated as "the active layer non-doped". In both the light-emitting diode element 1 according to the present embodiment and the light-emitting diode element according to the comparative example, the thickness of each of the barrier layers and the well layers is 10 nm and the injection current is 80 mA. In addition, in FIG. 3(b), values of the light-emitting diode element 1 according to the present embodiment are indicated as "p-doped", and values of the light-emitting diode element according to the comparative example are indicated as "non-doped".

As illustrated in FIG. 3(a), compared to the light-emitting diode element according to the comparative example, a light emission output is improved in the light-emitting diode element 1 according to the present embodiment. In addition, in the light-emitting diode element according to the comparative example, although a light emission output is improved as the number of quantum wells is increased until the number of quantum wells becomes 20, a light emission output is not improved in accordance with increase in the number of quantum wells when the number of quantum wells exceeds 20. In addition, as illustrated in FIG. 3(b), in the light-emitting diode element 1 according to the present embodiment, compared to the light-emitting diode element according to the comparative example, a light emission output is improved throughout substantially the entire range of the injection current from 0 mA to 500 mA. In FIG. 3(a), each of the light-emitting diode element 1 according to the present embodiment and the light-emitting diode element according to the comparative example is separately normalized. Therefore, although light emission output ratios are the same (1.0) as each other when the number of quantum wells is 20, an actual value of a light emission output of the light-emitting diode element 1 according to the present embodiment is larger than that of the light-emitting diode element according to the comparative example even when the number of quantum wells is 20 (refer to FIG. 3(b)).

Figure 4:
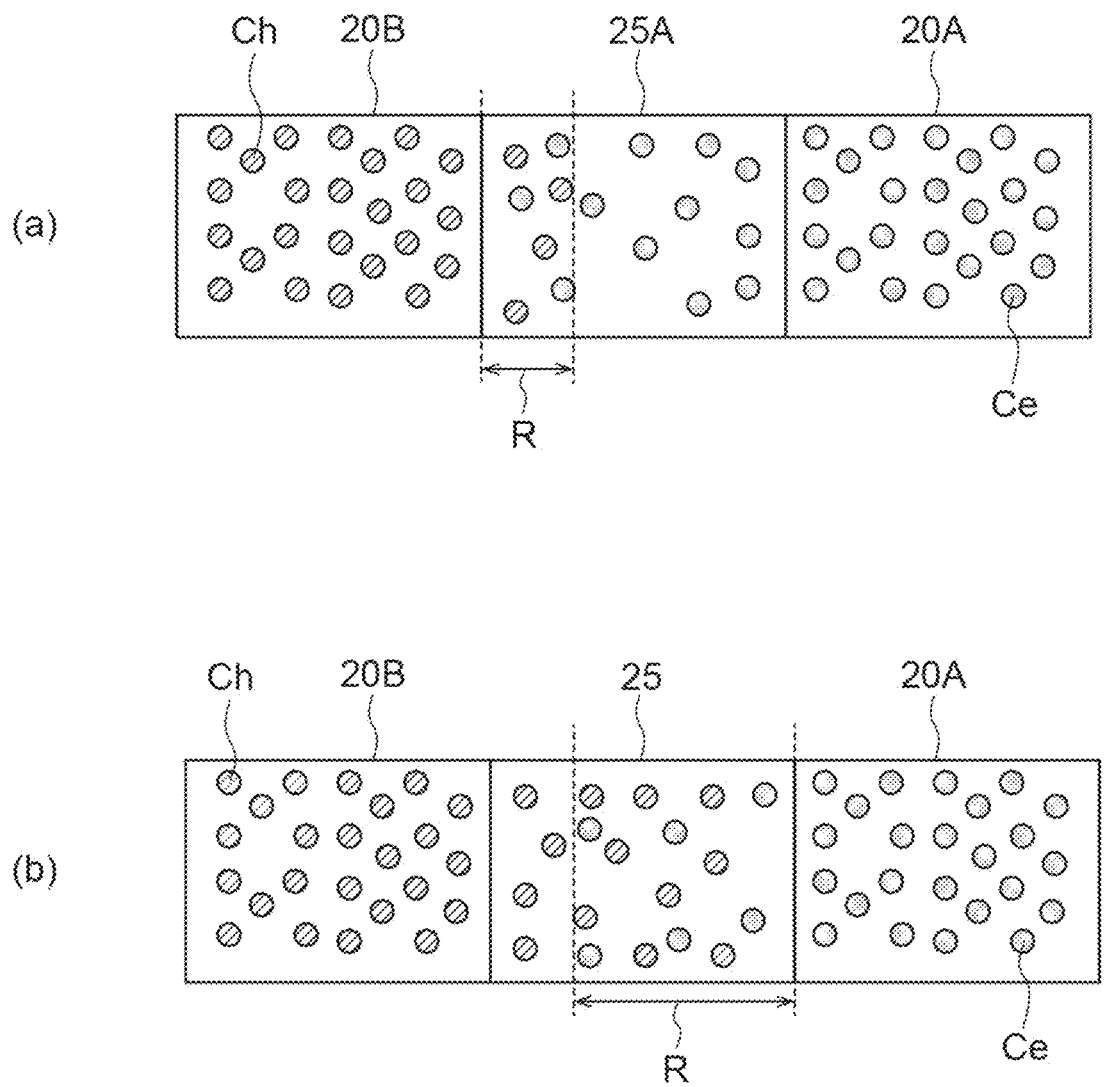
FIG. 4 is a schematic explanatory view of a principle of expected improvement in light emission output.

According to the knowledge of the present inventor, it is conceivable that a light emission output be improved by the light-emitting diode element 1 according to the present embodiment due to the following reason. FIG. 4 is a schematic view for explaining an assumed principle of improvement in light emission output. FIG. 4(a) illustrates the light-emitting diode element according to the comparative example (in which an active layer 25A is non-doped), and FIG. 4(b) illustrates the light-emitting diode element 1 according to the present embodiment.

As illustrated in FIG. 4(a), in the light-emitting diode element according to the comparative example, the non-doped active layer 25A has an n$^-$-type conductivity. Therefore, holes Ch are injected as minority carriers from the p-type semiconductor layer 20B (p$^+$-type) to the active layer 25A by current injection using the first electrode 51 and the second electrode 52. Accordingly, light emission occurs in a region R in which electrons Ce and the holes Ch are present inside the active layer 25A.

In contrast, as illustrated in FIG. 4(b), in the light-emitting diode element 1 according to the present embodiment, minority carriers injected into the active layer 25 having the p-type conductivity become the electrons Ce. A diffusion length L of the carriers is expressed as (diffusion coefficient D×carrier lifetime of $\tau$)$^{1/2}$. The diffusion coefficient D is proportional to a mobility $\mu$. Further, in compound semiconductors used in light emission diodes, electrons tend to have a higher mobility than holes, and this tendency is particularly strong in materials with which infrared light emission can be obtained. For example, in the case of InAs, the mobility $\mu$ is approximately 33,000 cm$^2$/V/sec in the electrons Ce and is approximately 450 cm$^2$/V/sec in the holes Ch. In the case of InSb, the mobility $\mu$ is approximately 77,000 cm$^2$/V/sec in the electrons Ce and is approximately 1,100 cm$^2$/V/sec in the holes Ch. In addition, in the case of InAsSb that is a mixed crystal of these, the mobility $\mu$, which varies depending on a composition ratio of As and Sb, is approximately 33,000 to 77,000 cm$^2$/V/sec in the electrons Ce and is approximately 450 to 1,100 cm$^2$/V/sec in the holes Ch. In AlInAs, the mobility $\mu$, which varies depending on a composition ratio of Al and In in a composition region having a bandgap of 1.2 eV or smaller, is approximately 9,000 to 33,000 cm$^2$/V/sec in the electrons Ce and is approximately 280 to 450 cm$^2$/V/sec in the holes Ch. Therefore, since the diffusion length L of the electrons Ce is longer than the diffusion length L of the holes Ch, the electrons Ce (minority carriers) are widely diffused inside the active layer 25.

As a result, in the light-emitting diode element 1 according to the present embodiment, compared to the light-emitting diode element according to the comparative example, the region R contributing to light emission extends. The same applies not only to the case in a depth direction (Z direction) toward the n-type semiconductor layer 20A from the p-type semiconductor layer 20B but also in a transverse direction (an X direction and a Y direction) intersecting the depth direction, and a distribution of minority carriers inside the active layer 25 is improved. For at least the foregoing reason, in the light-emitting diode element 1 according to the present embodiment, it is conceivable that a light emission output be improved.

Figure 5:
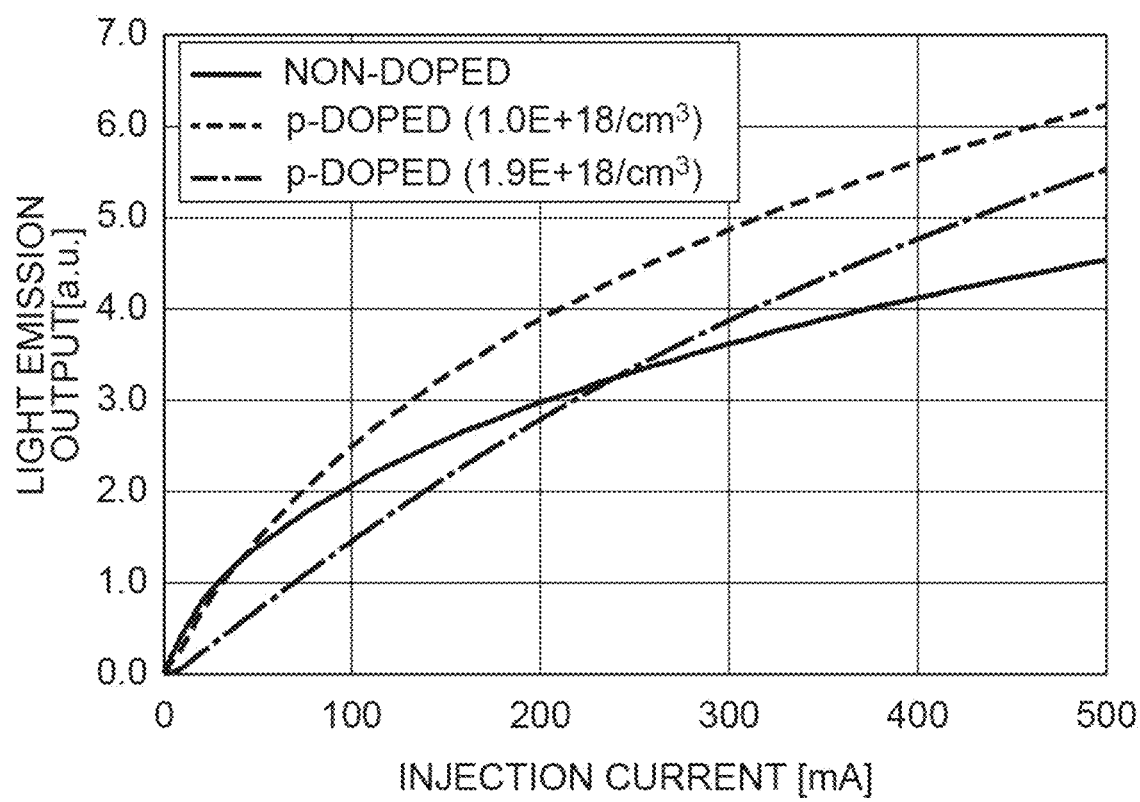
FIG. 5 is another graph showing characteristics of a light emission output of the light-emitting diode element.

As indicated by the dashed line graph in FIG. 5, and as described above regarding FIG. 3, if the concentration of the p-type impurities in the active layer 25 is approximately 1.0×10$^{18}$/cm$^3$, compared to the case of being non-doped, a light emission output is improved in substantially the entire range of the injection current from 0 mA to 500 mA. In contrast, as indicated by the one-dot dashed line graph in FIG. 5, if the concentration of the p-type impurities in the active layer 25 is approximately $1.9 \times 10^{18}/cm^3$, a portion in which a light emission output falls below that in the case of being non-doped begins to be generated in a part of the range of the injection current.

It is conceivable that one of the reasons for this be increase in crystal defects due to introduction of the p-type impurities and decrease in diffusion length due to reduction of the lifetime of minority carriers. Therefore, in consideration of this point, the upper limit for the concentration of the p-type impurities in the active layer 25 can be set to approximately $1.9 \times 10^{18}/cm^3$.

As described above, the light-emitting diode element 1 according to the present embodiment includes the active layer 25 having a multiple quantum well structure constituted of barrier layers including AlInAs and well layers including InAsSb alternately laminated therein. Further, the active layer 25 has the p-type conductivity. Therefore, as described in the foregoing knowledge, a light emission output can be improved by increasing the number of quantum wells.

As above, in the light-emitting diode element 1 according to the present embodiment, although a light emission output can be improved by increasing the number of quantum wells, in general, if increase in the number of quantum wells progresses, strain may be accumulated when it is produced, resulting in increase in crystal defects. In contrast, in the light-emitting diode element 1, the lattice constant of the barrier layers is smaller than the lattice constant of the n-type semiconductor layer 20A, and the lattice constant of the well layers is larger than the lattice constant of the n-type semiconductor layer 20A. Accordingly, in the light-emitting diode element 1, a light emission output can be improved by favorably increasing the number of quantum wells while increase in crystal defects due to accumulation of strain is curbed.

In addition, in the light-emitting diode element 1 according to the present embodiment, the active layer 25 includes ten or more pairs of the barrier layers and the well layers. In this manner, according to the light-emitting diode element 1, a light emission output can be improved by increasing the number of quantum wells to ten or more.

In addition, in the light-emitting diode element 1 according to the present embodiment, the concentration of the p-type impurities in the active layer 25 is $1.0 \times 10^{16}/cm^3$ to $1.9 \times 10^{18}/cm^3$. For this reason, a light emission output can be more reliably improved.

In addition, in the light-emitting diode element 1 according to the present embodiment, the degree of lattice mismatching between the average lattice constant of the barrier layers and the well layers and the lattice constant of the n-type semiconductor layer is 0.9% or less. For this reason, even when the number of quantum wells of the active layer 25 is increased, accumulation of strain can be more reliably curbed.

In addition, the light-emitting diode element 1 according to the present embodiment further includes the n-type barrier layer 24 disposed between the n-type semiconductor layer 20A and the active layer 25 and including AlInAs, and the p-type barrier layer 26 disposed between the active layer 25 and the p-type semiconductor layer 20B and including AlInAs. In this manner, the carriers can be favorably confined in the active layer 25 by providing the barrier layers 24 and 26 on both sides of the active layer 25.

Moreover, in the light-emitting diode element 1 according to the present embodiment, the semiconductor lamination portion 20 has the base portion 30 having the front surface 30a facing a side opposite to the semiconductor substrate 10, and the mesa portion 40 provided in the base portion 30 in a manner of protruding from an area of a part on the front surface 30a, having the top surface 40a facing a side opposite to the base portion 30, and including at least the active layer 25. In addition, the first electrode 51 is formed on the front surface 30a in a manner of surrounding the mesa portion 40 when viewed in the Z direction intersecting the front surface 30a. The second electrode 52 is formed on the top surface 40a in a manner of covering the central area 40ar of the top surface 40a. Further, the rear surface 10b of the semiconductor substrate 10 serves as a light emitting surface.

Figure 6:
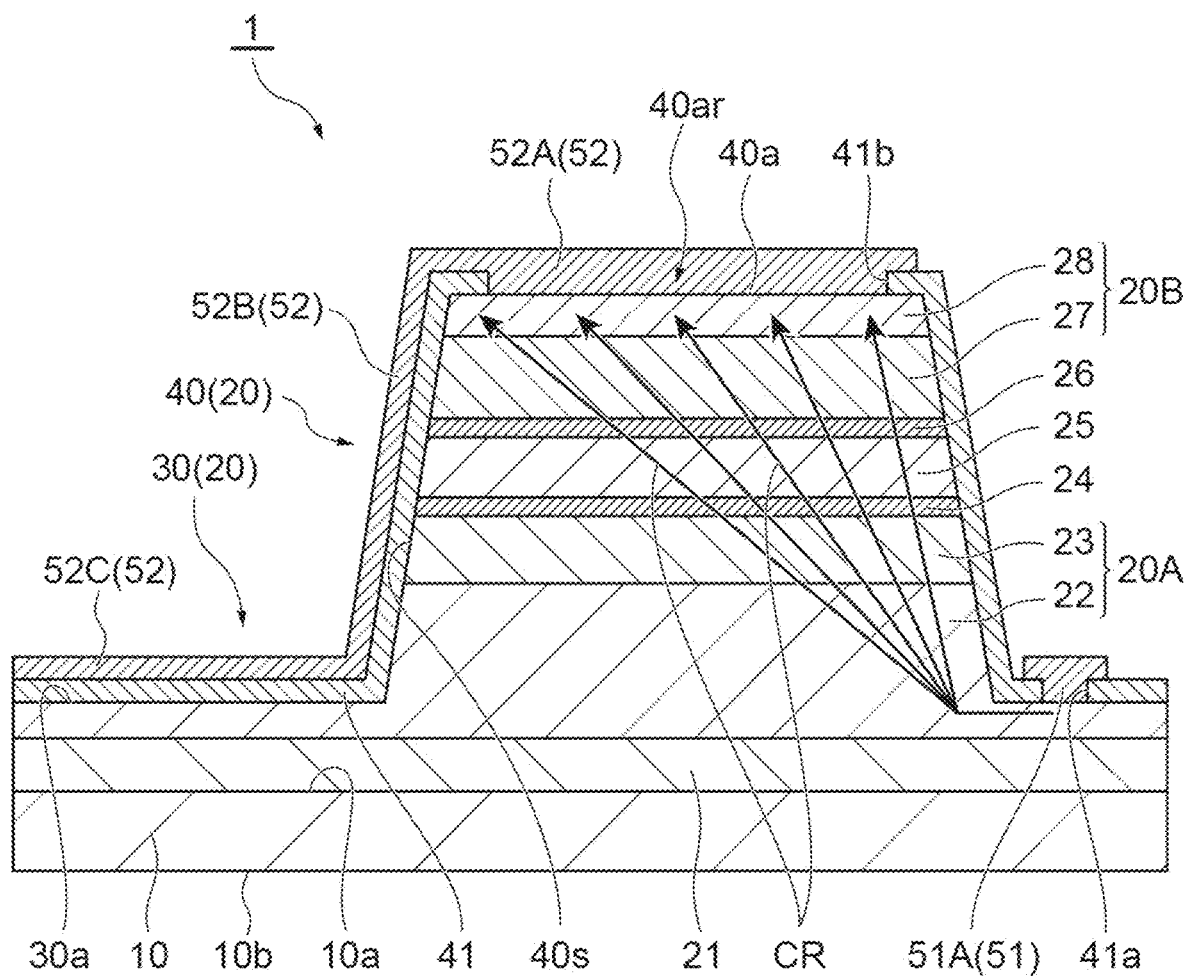
FIG. 6 is an explanatory cross-sectional view of operation and effects of the light-emitting diode element illustrated in FIGS. 1 and 2.
Figure 6:
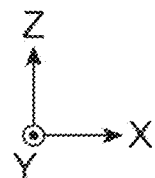

For this reason, as illustrated in FIG. 6, a current path CR is formed in a wider region in the mesa portion 40 due to the first electrode 51 surrounding the mesa portion 40 including the active layer 25 and the second electrode 52 on the top surface 40a of the mesa portion 40, and the rear surface 10b of the semiconductor substrate 10 on a side opposite to the top surface 40a of the mesa portion 40 having the second electrode 52 formed thereon serves as the light emitting surface. Therefore, a light emission output can be more reliably improved.

Figure 7:
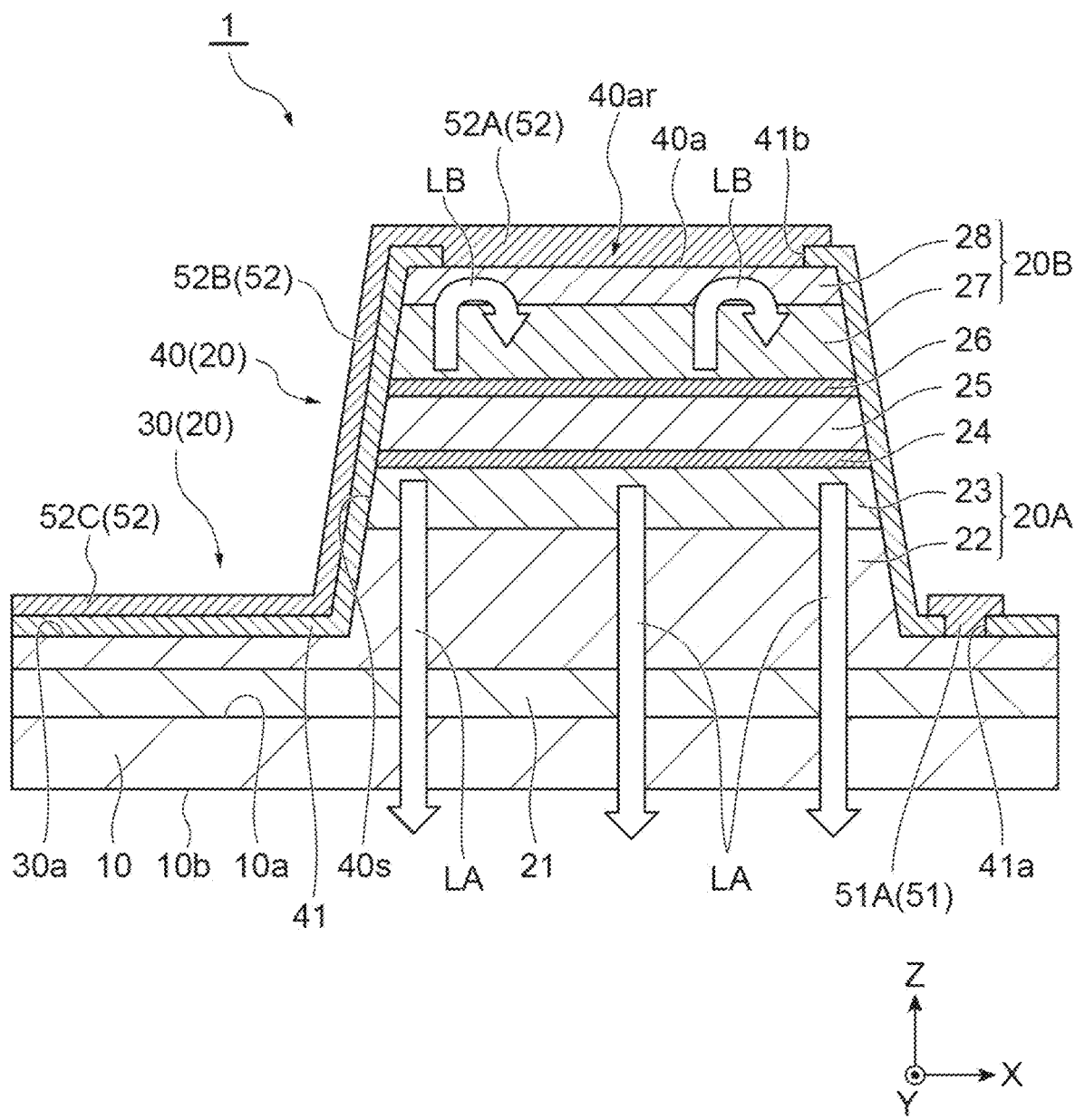
FIG. 7 is another explanatory cross-sectional view of operation and effects of the light-emitting diode element illustrated in FIGS. 1 and 2.

Particularly, according to this constitution, as illustrated in FIG. 7, a layer blocking light LA emitted from the active layer 25 to the rear surface 10b of the semiconductor substrate 10 side is not interposed therebetween, and light LB emitted from the active layer 25 to a side opposite to the semiconductor substrate 10 can be reflected toward the semiconductor substrate 10 side by the second electrode 52 and can be emitted from the rear surface 10b. In addition, since the n-type semiconductor layer 20A, the buffer layer 21, and the semiconductor substrate 10 have a relatively high transmittance, a loss of the light LA and the light LB is small. As a result, a light emission output can be more reliably improved.

Hereinafter, examples of the light-emitting diode element 1 according to the present embodiment will be given.

First Example

On a GaAs substrate serving as the semiconductor substrate 10, as the buffer layer 21, a GaAs buffer layer (0.2 μm), a low-temperature InAs buffer layer (0.2 μm), and an InAs buffer layer (0.2 μm) were caused to sequentially grow. On this InAs buffer layer, as the current diffusion layer 22 serving as both an n-type contact layer and a current diffusion layer, an InAs layer doped with n-type impurities of $3.0 \times 10^{18}/cm^3$ was caused to grow with a thickness of 4.0 μm. On this InAs layer, as the current block layer 23, an InAs layer doped with n-type impurities of $3.0 \times 10^{17}/cm^3$ was caused to grow with a thickness of 0.6 μm. On this InAs layer, as the n-type barrier layer 24, an $Al_xInAs$ layer (composition x=0.15) doped with n-type impurities of $3.0 \times 10^{18}/cm^3$ was caused to grow by 20 nm.

On this InAs layer, as the active layer 25, a multiple quantum well structure was formed by alternately producing ten AlInAs barrier layers having a thickness of 10 nm and ten InAsSb well layers having a thickness of 10 nm. At this time, all layers were doped with p-type impurities of $1.0 \times 10^{18}/cm^3$. On this multiple quantum well structure, as the p-type barrier layer 26, an $Al_xInAs$ layer (composition x=0.15) doped with p-type impurities of $3.0 \times 10^{18}/cm^3$ was caused to grow by 20 nm. The barrier layers were set to have a thickness not exceeding the critical film thickness with respect to the n-type semiconductor layer and the composition of Al while having a composition x of Al higher than the composition of Al in the barrier layers.

On this AlInAs layer, as the semiconductor layer 27, an InAs layer doped with p-type impurities of $5.0 \times 10^{18}/cm^3$ was caused to grow by 0.5 μm. Moreover, as the contact layer 28, an InAs layer doped with p-type impurities of $1.0 \times 10^{19}/cm^3$ was caused to grow by 0.1 μm. An epitaxial wafer which has been completed as described above was made into chips by a normal semiconductor process, and a light-emitting diode element was obtained. Even in such a light-emitting diode element, effects similar to those of the foregoing light-emitting diode element 1 could be obtained. The light emission wavelength of the light-emitting diode element according to a first example was approximately 4.3 μm, for example.

Second Example

On a GaAs substrate serving as the semiconductor substrate 10, as the buffer layer 21, a GaAs buffer layer (0.2 μm), a low-temperature InAs buffer layer (0.2 μm), and an InAs buffer layer (0.2 μm) were caused to sequentially grow. On this InAs buffer layer, as the current diffusion layer 22 serving as both an n-type contact layer and a current diffusion layer, an AlInAs layer (composition x=0.05) doped with n-type impurities of $3.0 \times 10^{18}/cm^3$ was caused to grow with a thickness of 4.0 μm. On this AlInAs layer, as the current block layer 23, an $Al_xInAs$ layer (composition x=0.05) doped with n-type impurities of $3.0 \times 10^{17}/cm^3$ was caused to grow with a thickness of 0.6 μm. On this InAs layer, as the n-type barrier layer 24, an AlInAs layer (composition x=0.2) doped with n-type impurities of $3.0 \times 10^{18}/cm^3$ was caused to grow by 20 nm.

On this InAs layer, as the active layer 25, a multiple quantum well structure was formed by alternately producing ten AlInAs barrier layers having a thickness of 10 nm and ten InAsSb well layers having a thickness of 10 nm. At this time, all layers were doped with p-type impurities of $1.0 \times 10^{18}/cm^3$. On this multiple quantum well structure, as the p-type barrier layer 26, an AlInAs layer (composition x=0.15) doped with p-type impurities of $3.0 \times 10^{18}/cm^3$ was caused to grow by 20 nm. The barrier layers were set to have a thickness not exceeding the critical film thickness with respect to the n-type semiconductor layer and the composition of Al while having the composition x and a composition y of Al higher than the composition of Al in the barrier layers.

On this AlInAs layer, as the semiconductor layer 27, an AlInAs layer (composition x=0.05) doped with p-type impurities of $5.0 \times 10^{18}/cm^3$ was caused to grow by 0.5 μm. Moreover, as the contact layer 28, an AlInAs layer (composition x=0.05) doped with p-type impurities of $1.0 \times 10^{19}/cm^3$ was caused to grow by 0.1 μm. An epitaxial wafer which has been completed as described above was made into chips by a normal semiconductor process, and a light-emitting diode element was obtained. Even in such a light-emitting diode element, effects similar to those of the foregoing light-emitting diode element 1 could be obtained. The light emission wavelength of the light-emitting diode element according to the first example was approximately 3.3 μm, for example.

Third Example

On a GaAs substrate serving as the semiconductor substrate 10, as the buffer layer 21, a GaAs buffer layer (0.2 μm), a GaSb buffer layer (0.1 μm), and an InAs buffer layer (0.1 μm) were caused to sequentially grow. On this InAs buffer layer, as the current diffusion layer 22 serving as both an n-type contact layer and a current diffusion layer, an AlInAs layer (composition x=0.05) doped with n-type impurities of $3.0 \times 10^{18}/cm^3$ was caused to grow with a thickness of 4.0 μm. On this AlInAs layer, as the current block layer 23, an AlInAs layer (composition x=0.05) doped with n-type impurities of $3.0 \times 10^{17}/cm^3$ was caused to grow with a thickness of 0.6 μm. On this InAs layer, as the n-type barrier layer 24, an AlInAs layer (composition x=0.2) doped with n-type impurities of $3.0 \times 10^{18}/cm^3$ was caused to grow by 20 nm.

On this InAs layer, as the active layer 25, a multiple quantum well structure was formed by alternately producing ten AlInAs barrier layers having a thickness of 10 nm and ten InAsSb well layers having a thickness of 10 nm. At this time, all layers were doped with p-type impurities of $1.0 \times 10^{18}/cm^3$. On this multiple quantum well structure, as the p-type barrier layer 26, an AlInAs layer (composition x=0.15) doped with p-type impurities of $3.0 \times 10^{18}/cm^3$ was caused to grow by 20 nm. The barrier layers were set to have a thickness not exceeding the critical film thickness with respect to the n-type semiconductor layer and the composition of Al while having the composition x and the composition y of Al higher than the composition of Al in the barrier layers.

On this AlInAs layer, as the semiconductor layer 27, an $Al_xInAs$ layer (composition x=0.05) doped with p-type impurities of $5.0 \times 10^{18}/cm^3$ was caused to grow by 0.5 μm. Moreover, as the contact layer 28, an $Al_xInAs$ layer (composition x=0.05) doped with p-type impurities of $1.0 \times 10^{19}/cm^3$ was caused to grow by 0.1 μm. An epitaxial wafer which has been completed as described above was made into chips by a normal semiconductor process, and a light-emitting diode element was obtained. Even in such a light-emitting diode element, effects similar to those of the foregoing light-emitting diode element 1 could be obtained. The light emission wavelength of the light-emitting diode element according to the first example was approximately 3.3 μm, for example.

Fourth Example

On a GaAs substrate serving as the semiconductor substrate 10, as the buffer layer 21, a GaAs buffer layer (0.2 μm), a low-temperature InAs buffer layer (0.2 μm), and an InAs buffer layer (0.2 μm) were caused to sequentially grow. On this InAs buffer layer, as the current diffusion layer 22 serving as both an n-type contact layer and a current diffusion layer, an $InGa_xAs$ layer (composition x=0.13) doped with n-type impurities of $3.0 \times 10^{18}/cm^3$ was caused to grow with a thickness of 4.0 μm. On this InGaAs layer, as the current block layer 23, an $InGa_xAs$ layer (composition x=0.13) doped with n-type impurities of $3.0 \times 10^{17}/cm^3$ was caused to grow with a thickness of 0.6 μm. On this GaAs layer, as the n-type barrier layer 24, an $Al_xInAs$ layer (composition x=0.2) doped with n-type impurities of $3.0 \times 10^{18}/cm^3$ was caused to grow by 20 nm.

On this InAs layer, as the active layer 25, a multiple quantum well structure was formed by alternately producing ten AlInAs barrier layers having a thickness of 10 nm and ten InAsSb well layers having a thickness of 10 nm. At this time, all layers were doped with p-type impurities of $1.0 \times 10^{18}/cm^3$. On this multiple quantum well structure, as the p-type barrier layer 26, an AlInAs layer (composition x=0.15) doped with p-type impurities of $3.0 \times 10^{18}/cm^3$ was caused to grow by 20 nm. The barrier layers were set to have a thickness not exceeding the critical film thickness with respect to the n-type semiconductor layer and the composition of Al while having the composition x and the composition y of Al higher than the composition of Al in the barrier layers.

On this AlInAs layer, as the semiconductor layer 27, an InGa$_x$As layer (composition x=0.13) doped with p-type impurities of $5.0\times10^{18}/cm^3$ was caused to grow by 0.5 μm. Moreover, as the contact layer 28, an InGa$_x$InAs layer (composition x=0.13) doped with p-type impurities of $1.0\times10^{19}/cm^3$ was caused to grow by 0.1 μm. An epitaxial wafer which has been completed as described above was made into chips by a normal semiconductor process, and a light-emitting diode element was obtained. Even in such a light-emitting diode element, effects similar to those of the foregoing light-emitting diode element 1 could be obtained. The light emission wavelength of the light-emitting diode element according to the first example was approximately 3.3 μm, for example.

The foregoing embodiment and the examples describe an aspect of the present disclosure. Therefore, the present disclosure is not limited to the foregoing light-emitting diode elements and can be arbitrarily deformed.

Figure 8:
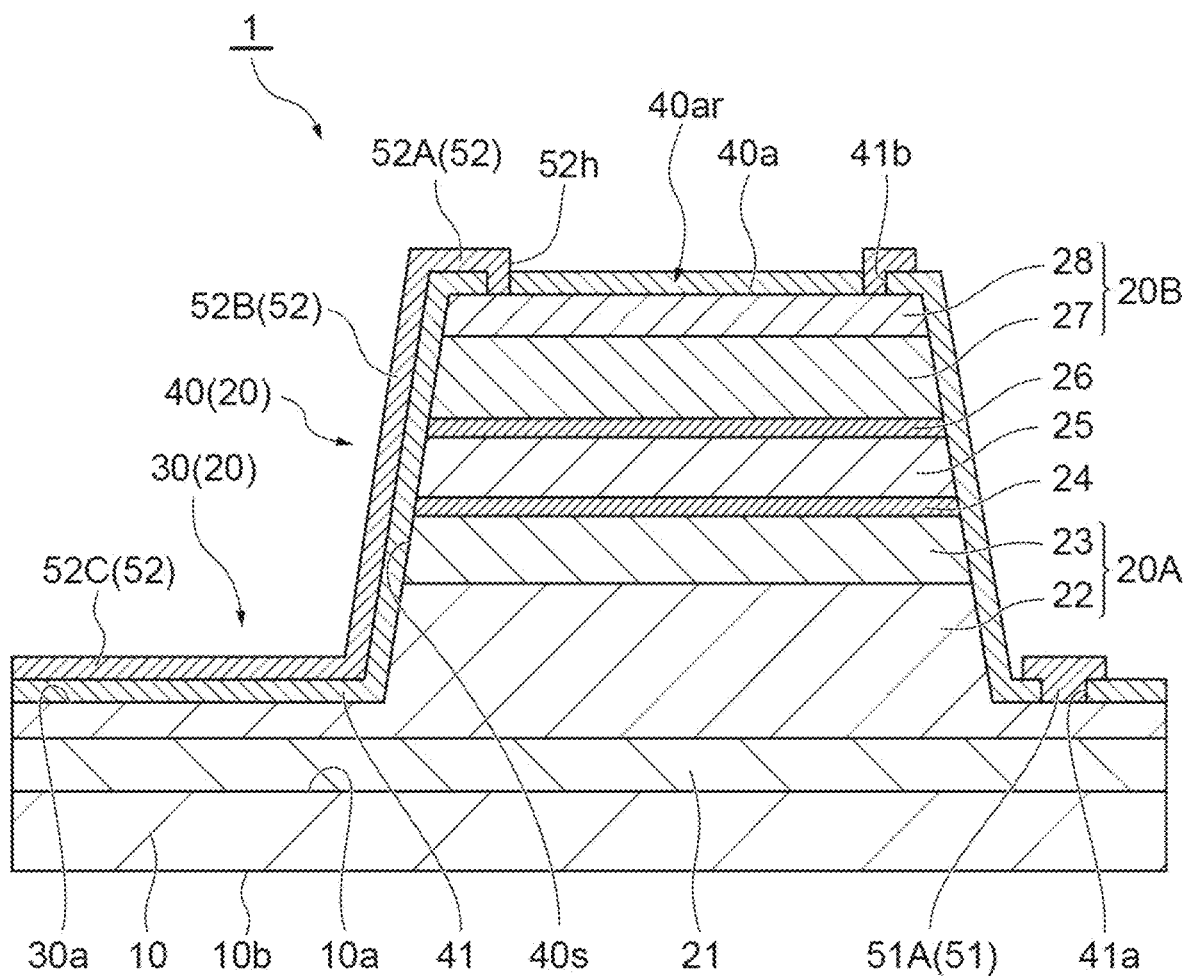
FIG. 8 is a cross-sectional view of a light-emitting diode element according to a modification example.

For example, in the foregoing embodiment, a rear surface emission-type light-emitting diode element 1 has been described as an example. However, as illustrated in FIG. 8, the light-emitting diode element 1 may have a constitution in which an opening 52h is formed such that a central part of the central area 40ar on the top surface 40a of the mesa portion 40 is exposed to the first part 52A of the second electrode 52 so that light is emitted through the opening 52h. In this case, the light-emitting diode element 1 is constituted as a front surface emission type.

In addition, in the foregoing embodiment, the semiconductor substrate 10 serving as a substrate has been described as an example. However, in place of the semiconductor substrate 10, a substrate such as a polymer film, a glass substrate, a plastic, or a metal plate may be used. Moreover, in the foregoing embodiment, the conductivity types of the semiconductor layers are set in the order of the n-type and the p-type from the semiconductor substrate 10 side but may be set in the order of the p-type and the n-type from the semiconductor substrate 10 side.

INDUSTRIAL APPLICABILITY

A light-emitting diode element in which a light emission output can be improved is provided.

REFERENCE SIGNS LIST

1 Light-emitting diode element
10 Semiconductor substrate
10a Main surface (first surface)
10b Rear surface (second surface)
20 Semiconductor lamination portion
20A n-type semiconductor layer
20B p-type semiconductor layer
24 Barrier layer (n-type barrier layer)
25 Active layer
26 Barrier layer (p-type barrier layer)
30 Base portion
30a Front surface (third surface)
40 Mesa portion
40a Top surface
40ar Central area
51 First electrode
52 Second electrode

The invention claimed is:

1. A light-emitting diode element comprising:
a semiconductor substrate having a first surface and a second surface on a side opposite to the first surface;
a semiconductor lamination portion formed on the first surface of the semiconductor substrate;
a first electrode connected to a part of the semiconductor lamination portion on the semiconductor substrate side; and
a second electrode connected to a part of the semiconductor lamination portion on a side opposite to the semiconductor substrate,
wherein the semiconductor lamination portion includes
an n-type semiconductor layer,
an active layer having a p-type conductivity and laminated on the n-type semiconductor layer, and
a p-type semiconductor layer laminated on the active layer on a side opposite to the n-type semiconductor layer,
wherein the active layer has a multiple quantum well structure constituted of barrier layers including AlInAs and well layers including InAsSb alternately laminated therein,
wherein a lattice constant of the barrier layers is smaller than a lattice constant of the n-type semiconductor layer, and
wherein a lattice constant of the well layers is larger than the lattice constant of the n-type semiconductor layer.

2. The light-emitting diode element according to claim 1, wherein the active layer includes ten or more pairs of the barrier layers and the well layers.

3. The light-emitting diode element according to claim 1, wherein a concentration of p-type impurities in the active layer is $1.0\times10^{16}/cm^3$ to $1.9\times10^{18}/cm^3$.

4. The light-emitting diode element according to claim 1, wherein a degree of lattice mismatching between an average lattice constant of the barrier layers and the well layers and the lattice constant of the n-type semiconductor layer is 0.9% or less.

5. The light-emitting diode element according to claim 1 further comprising:
an n-type barrier layer disposed between the n-type semiconductor layer and the active layer and including AlInAs; and
a p-type barrier layer disposed between the active layer and the p-type semiconductor layer and including AlInAs.

6. The light-emitting diode element according to claim 1, wherein the semiconductor lamination portion has
a base portion having a third surface facing a side opposite to the semiconductor substrate, and
a mesa portion provided in the base portion in a manner of protruding from an area of a part on the third surface, having a top surface facing a side opposite to the base portion, and including at least the active layer,
wherein the first electrode is formed on the third surface in a manner of surrounding the mesa portion when viewed in a direction intersecting the third surface,
wherein the second electrode is formed on the top surface in a manner of covering a central area of the top surface, and wherein the second surface of the semiconductor substrate serves as a light emitting surface.

* * * * *